(12) United States Patent
Salvatore

(10) Patent No.: US 6,647,046 B1
(45) Date of Patent: Nov. 11, 2003

(54) MODE-SELECTIVE FACET LAYER FOR PUMP LASER

(75) Inventor: Randal A. Salvatore, Watertown, MA (US)

(73) Assignee: Corning Lasertron, Inc., Bedford, MA (US)

( * ) Notice: Subject to any disclaimer, the term of this patent is extended or adjusted under 35 U.S.C. 154(b) by 0 days.

(21) Appl. No.: 09/448,046

(22) Filed: Nov. 23, 1999

(51) Int. Cl.$^7$ .............................. H01S 5/00; H01S 3/08
(52) U.S. Cl. .............................. 372/49; 372/98; 372/99
(58) Field of Search .......................... 372/3, 6, 49, 69, 372/70, 71, 72, 75, 19, 98, 99

(56) References Cited

U.S. PATENT DOCUMENTS

| | | | |
|---|---|---|---|
| 3,617,930 A | 11/1971 | Snitzer et al. ............. | 331/94.5 |
| 3,628,173 A | 12/1971 | Danielmeyer .............. | 331/94.5 |
| 3,663,890 A | 5/1972 | Schulthess et al. ........ | 331/94.5 |
| 4,081,760 A | 3/1978 | Berg ......................... | 331/94.5 |
| 4,284,963 A | 8/1981 | Allen, Jr. et al. .......... | 331/94.5 |
| 4,358,851 A | 11/1982 | Scifres et al. ................. | 372/97 |
| 4,675,873 A | 6/1987 | Miller ......................... | 372/19 |
| 4,726,030 A | 2/1988 | Fye ............................ | 372/50 |
| 4,805,184 A * | 2/1989 | Fiddyment et al. ........... | 372/45 |
| 4,805,185 A | 2/1989 | Smith .......................... | 372/97 |
| 4,951,292 A | 8/1990 | Kuindersma et al. ......... | 372/49 |
| 5,185,754 A | 2/1993 | Craig et al. .................. | 372/45 |
| 5,339,326 A | 8/1994 | Tsujimura et al. ............ | 372/49 |
| 5,629,954 A * | 5/1997 | Jansen et al. ............... | 372/108 |
| 5,661,743 A * | 8/1997 | Nagai ......................... | 372/46 |
| 6,304,587 B1 * | 10/2001 | Zah ............................. | 372/46 |
| 6,449,301 B1 * | 9/2002 | Wu et al. ..................... | 372/92 |

FOREIGN PATENT DOCUMENTS

| | | | |
|---|---|---|---|
| EP | 0609126 A | 8/1994 | |
| EP | 0 991 153 A1 | 4/2000 | ............. H01S/3/18 |
| JP | 11186641 | 9/1999 | |

OTHER PUBLICATIONS

Hartl, E., et al., "Polarization of $\lambda$=1.55 $\mu$m InGaAsP Ridge—Waveguide Lasers," *Japanese Journal of Applied Physics*, 27(1): 104–106 (1988).

* cited by examiner

Primary Examiner—Quyen Leung
Assistant Examiner—Cornelius H Jackson
(74) Attorney, Agent, or Firm—Juliana Agon; Timothy J. Meagher; Hamilton, Brook, Smith & Reynolds, PC

(57) ABSTRACT

A semiconductor pump laser comprises a ridge waveguide electro-optical structure, which converts a ridge injection current into light and an integrated wavelength selective facet reflector. This reflector controls the longitudinal modal operation of the pump laser. Specifically, the reflector comprises a first reflective structure for reflecting light to return through the ridge waveguide electro-optical structure. A second reflective structure provides wavelength-selective reflectivity when operating in combination with the first reflective structure. In other words, the phase of light reflected from the first and second reflective structures is such that the net reflectivity of the facet is wavelength selective, or favors certain wavelengths over other wavelengths.

23 Claims, 7 Drawing Sheets

MODE-SELECTIVE FACET LAYER FOR PUMP LASER

BACKGROUND OF THE INVENTION

Rare-earth-doped fiber amplifiers have been increasingly deployed in fiber optic signal transmission systems, with Raman-based amplification systems being tested for commercial deployment. Previously, over long distance fiber optic transmission links, the optical signal was detected at periodic distances by an opto-electronic detector and converted into an electrical signal, which was then used to drive a laser diode to in effect regenerate the optical signal for retransmission over the next section of the link. The distance between these opto-electronic systems was dictated by the attenuation at the signal frequencies of the fiber, and if any one of these opto-electronic devices failed, the entire optical transmission link failed. In contrast, fiber amplification systems enable optical signals to be re-amplified without conversion to electrical signals. With the advent of fiber amplification systems, the distance between electro-optical devices was no longer attenuation-limited.

Under the model, the fiber amplifiers are distributed along the link to amplify the optical signals or counter pumping into regular fiber is implemented with Raman pump arrays at the link terminus. Opto-electronic devices are only provided along the link at distances beyond which chromatic dispersion and other effects would impair signal demodulation.

Another advantage associated with the use of fiber amplification in optical transmission links is related to their broad gain spectrum. This feature makes dense wavelength division multiplexed systems realistic since multiple channels can be simultaneously amplified using a single fiber amplifier. Currently, WDM systems using fiber amplification have been deployed with 50–100 channels, with even larger channel systems being proposed.

The fiber amplification systems require relatively few components. They comprise a rare-earth-doped fiber or possible standard fiber in the case of Raman systems. Commonly, erbium-doped fiber amplifiers are used since they have a gain spectrum surrounding 1550 nanometers (nm), where there is a transmission window in commonly deployed silica optic fiber. Erbium-doped fiber amplification systems are usually pumped by laser diode pumps, operating at 980 nm or 1480 nm, while Raman systems use a broad range of pump wavelengths, ranging from about 1300 nm to 1600 nm.

Clean signal amplification is achieved by closely regulating the pump light. In broad-bandwidth WDM amplifiers, both power and wavelength stability of pump lasers should satisfy stringent requirements to avoid noise insertion into the signal frequencies. Additionally, shifting of pump wavelength can ruin gain flatness of fiber amplifiers. This robs power away from some channels and degrades their bit error rates. Typically, the wavelength of pump lasers increases slightly with increasing laser drive current as a fundamental result of the increase in junction temperature. The gain peak of semiconductor lasers typically shifts about 0.3 nm/° C. These wavelength changes can induce changes in the gain spectrum of fiber amplifiers. See K. W. Bennet, et al, "980 nm band pump wavelength tuning of the gain spectrum of EDFAs", OSA Annual Mtg., PD4-1, 1997. If the laser wavelength is controlled mainly by the semiconductor gain spectrum, wavelength control can be inadequate.

In some implementations spectral shifting of pump lasers is controlled by the use of fiber Bragg gratings between the laser pump chip and the fiber amplifier. These have the effect of helping to lock the emission wavelengths of the pump laser system. These fiber gratings, however, are expensive and complicate the deployment of the pump laser modules in amplifier systems.

Other methods have been used in the past to control the wavelength of semiconductor lasers. The earliest etalon stabilization techniques used an angled etalon, which serves as a transmissive filter. A reflection was provided by a mirror (or mirrors) on the opposite side of the etalon. This method, however, is not capable of providing a compact, integrated structure. See Berg, U.S. Pat. No. 4,081,760; Danielmeyer, U.S. Pat. No. 3,628,173.

External reflective mirrors or gratings (with filter and mirror integrated) have been used to feed a portion of the laser light back into the laser. External reflectors or gratings can induce instabilities in the output power due to multi-cavity effects. Abrupt mode hopping and larger power fluctuation often are induced due to cavity mode competition interacting with semiconductor laser nonlinearity. This in addition to the added complexity, positional sensitivity, temperature sensitivity, nonlinear power-current curves, and higher cost make this method generally inadequate for pump lasers.

Another configuration called the cleaved-coupled cavity ($C^3$) laser uses a cleave or etched groove to create a second resonant cavity. It is difficult to apply protective coating to the internal facets of the cleaved cavity. As a result, oxidation of the internal cleaved surfaces causes deterioration of the laser. Moreover, the spacing between reflective surfaces is hard to control within a fraction of a percent. The $C^3$ laser also has the added complication of a third electrode which must be driven to avoid semiconductor loss. See Allen, et al., U.S. Pat. No. 4,284,963; Scifres, et al., U.S. Pat. No. 4,358,851; Craig, et al., U.S. Pat. No. 5,185,754.

Another method uses a grating (or corrugation) within the semiconductor to achieve narrow band selectivity. This has been done with a distributed Bragg reflector (DBR) grating, which reflects a narrow band of light at one end of the cavity, or with a distributed feedback (DFB) grating, which fills the length of the laser. These both add significant complexity to the chip fabrication. Neither has shown adequate reliability and mode control to date at the powers needed for pump lasers.

Still another method uses an etalon that is selected to transmit only light in a desired narrow frequency band. Thin $\lambda/2$ layers are used as spacers between multi-layer dielectric or single-layer metallic stacks. This is an example of a resonant etalon. The etalon is designed for maximum transmission at the desired wavelength. This geometry of etalon is also unable to provide subsequent trimming of the wavelength and it presents very low selectivity of the wavelength and has unproven ability to hit the desired design wavelength. See Jansen, et. al., U.S. Pat. No. 5,629,954.

Another structure has used dielectric coatings on an adjacent body attached with a resilient material to achieve single mode operation. See Smith, et al., U.S. Pat. No. 4,805,185. There are additional single mode lasers that use reflective structures that incorporate a spatially periodic structure adjacent to the laser. See Miller, et al, U.S. Pat. No. 4,675,873.

SUMMARY OF THE INVENTION

For pump lasers, single mode operation is not generally required; wavelength stabilization within a narrow band is desired. The previously described techniques do not provide for a wavelength selective element integrated directly on the laser. An integrated wavelength control element is preferable since it does not induce the additional closely spaced cavity modes that an external cavity does. Over the past few years, coating processes have improved significantly, making adequate low-stress, thick-film, reliable deposition possible directly on the semiconductor Historically, the term etalon has referred to a Fabry-Perot etalon or interferometer. It includes a plane-parallel plate of thickness $L_2$ and index $n_e$ which is bounded on each side by a partial reflector. See A. Yariv, Optical Electronics, $3^{rd}$ Edition, Holt, Rinehart, and Winston Inc., chapter 4, 1985 and L. A. Coldren and S. W. Corzine, Diode Lasers and Photonic Circuits, John Wiley & Sons, Inc, pp 73–85, 1995. An etalon is a resonator.

More generally, etalon devices have been commonly used to restrict the longitudinal mode of operation. These intracavity structures typically have periodic spectral transmission peaks. These transmission peaks favor a few longitudinal modes within the laser's gain curve, thus, yielding a narrower spectral envelope of longitudinal modes in the typical implementation. As previously mentioned, the lasing wavelength of a diode laser will shift about 0.3 nm/C when its wavelength is set by the material gain spectrum. It is preferable to have a less temperature-sensitive structure control the lasing wavelength. The integrated etalon structure can fulfill this need for more stringent wavelength stabilization requirements.

In semiconductor lasers, etalons have been demonstrated. For use in commercial systems, however, some form of integrated etalon would be required for manufacturability. Proposed designs, however, do not appear to have met with any success.

The present invention utilizes a system to spectrally select a narrow band of laser cavity modes. Rather than an intracavity device, however, the present invention utilizes an integrated, wavelength-selective facet reflector. This reflector functions essentially as a bandpass filter, which restricts the laser to only a narrow wavelength band. The reflector can be termed an anti-resonant etalon.

In general, according to one aspect, the invention features a semiconductor pump laser. This laser comprises a ridge waveguide electro-optical structure, which converts a ridge injection current into light. This is a common feature of most semiconductor lasers where a ridge is etched into at least a top cladding layer to form a waveguide. In some implementations, however, the ridge can be etched down through the active layer.

The pump laser further comprises an integrated wavelength selective facet reflector. This reflector controls the longitudinal modal operation of the pump laser. Specifically, the reflector comprises a first reflective structure for reflecting light to return through the ridge waveguide electro-optical structure. A second reflective structure provides wavelength-selective reflectivity when operating in combination with the first reflective structure. In other words, the phase of light reflected from the first and second reflective structures is such that the net reflectivity of the facet is wavelength selective, or favors certain wavelengths over other wavelengths.

In the typical implementation under current technology, the pump laser operates at approximately 980 nm and functions as a pump for a dense wavelength division multiplex (DWDM) system, utilizing erbium-doped fiber amplifiers. The wavelength selective reflectivity of the reflective structures provides modal stability and thus reduces temporal power fluctuations to reduce spectral gain shifts in the system that would be otherwise created by the pump laser. It should be noted, however, that the principles of the present invention can also be applied to other lasers to reduce power fluctations, such as those operating at 1480 nm for EDFA's or the broader range of pump wavelengths used in Raman amplification schemes.

In the preferred embodiment, the total thickness on the first and second reflective structures is less than 100 micrometers. This limits light loss to beam divergence at the facet. In the preferred embodiment, however, it is substantially less, less than 20 micrometers.

In an implementation of a back etalon stabilized pump, the first reflective structure comprises about five quarter-wave layers of alternating low and high index material. The second reflector then comprises a relatively thick layer. This layer can have an optical thickness of 10–50, or specifically 30 wavelengths at the laser's wavelength of operation.

When used as a pump laser, high power output, in addition to modal stability, is often desirable. As a result, some front facet reflectivity is preferred, typically between 3 and 10%. In the preferred embodiment of the back etalon stabilized pump, a front facet reflectivity is nominally 4%, specifically, 4% +/−0.5%.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
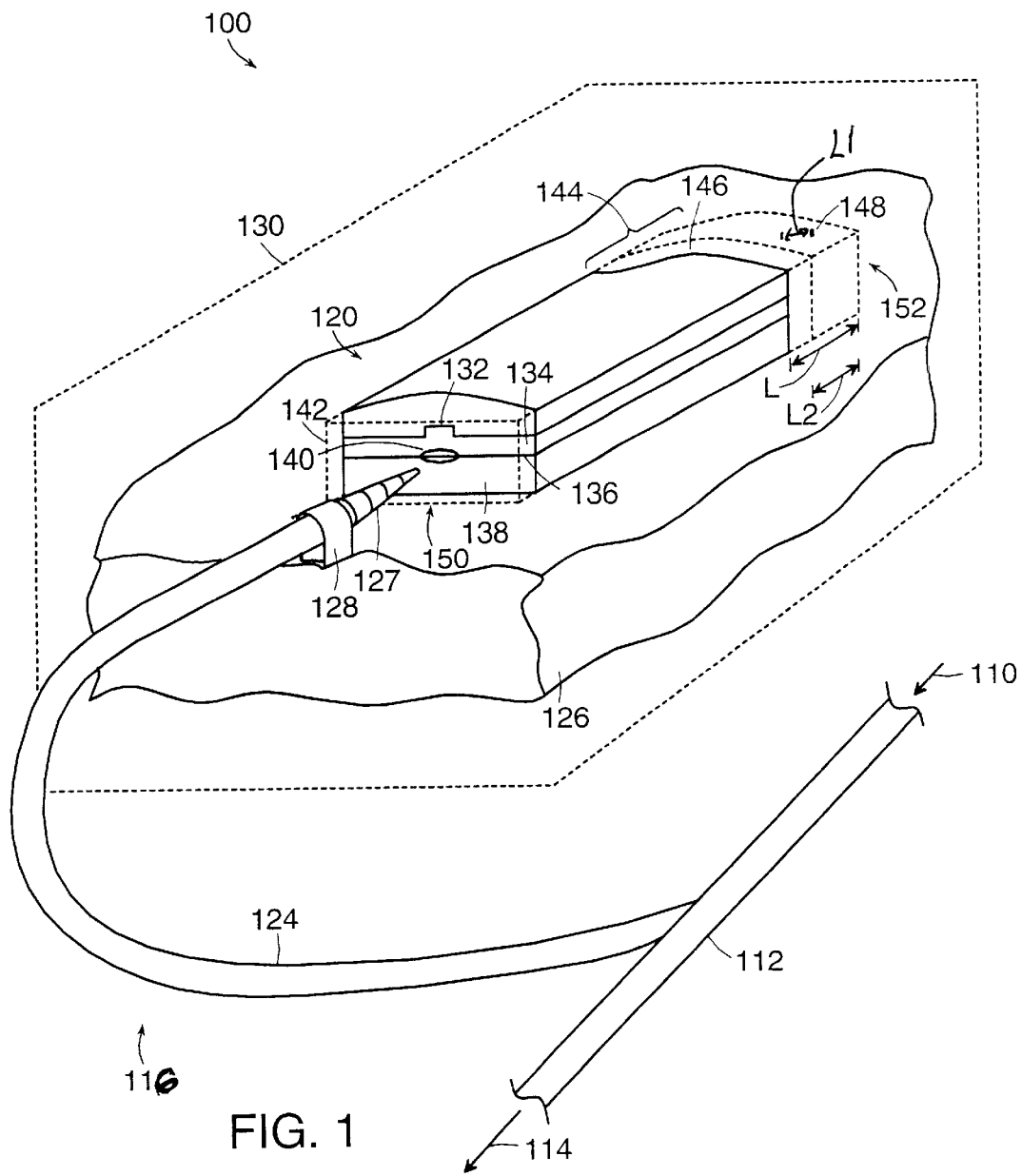
FIG. 1 is a schematic, perspective view of a pump laser in a fiber amplification system, according to the present invention.

FIG. 1 shows a fiber amplifier system 100 in which the principles of the present invention are utilized.

The fiber amplifier system 100 in one implementation, operates in a wavelength division multiplexing system. In this context, the signal-in 110 comprises multiple channels such as 50–100, operating at different, but typically closely spaced, carrier frequencies. For example, channel spacings of 50–100 GHz are common. These channels are collectively amplified as signal-out 114 by the fiber amplifier 112 for transmission typically to the next fiber amplifier, or a detector system.

In one embodiment, the fiber amplifier 112 is an erbium-doped fiber, which amplifies signal frequencies at approximately 1550 nm. Specifically, in currently available erbium fiber amplifiers, the gain spectrum extends from about 1510 to 1630 nm. However, in other implementations regular fiber can be used in a Raman amplification system.

In the illustrated embodiment, the fiber amplifier 112 is pumped by at least one laser diode pump system 116. Each of these pump systems comprises a laser diode pump 120. The pump 120 couples light into a fiber pigtail 124, which transmits the light to the gain fiber or fiber amplifier 112. Coupling efficiency is usually preferably maximized by some lens arrangement between the pump 120 and pigtail 124. A fiber lens is shown, although a discrete lens and butt coupling could also be used, for example.

Although a single pump is shown, which transmits light counter to the direction of signal light propagation, other pumping arrangements are known and this invention is applicable to them. For example, single pumps or multiple pump systems can be used working either with or both counter and with the direction of signal light transmission along the fiber 112.

According to further aspects of the illustrated embodiment, the laser diode pump 120 is secured to a submount substrate 126. This submount substrate 126 typically provides electrical connections to the pump 120 and also is used in temperature control, i.e., heat dissipation. The end of the pigtail is also typically secured to the submount 126 using techniques such as solder reflow or laser welded brackets 128. The submount 126 is then typically mounted within an environmentally controlled package 130. This package usually has pins for electrical connections into the larger amplification system.

Also, as illustrated, the pump chip 120 is a ridge-waveguide device. Specifically, a ridge 132 etched into an upper cladding layer 134 and acts as a weakly-light guiding structure for light generated in the active layer 136. The active layer 136 is located on a lower cladding layer 138.

It should be appreciated, however, that the present invention also can be applicable to buried hetero-structure systems where the ridge is etched down through the active layer. In either case, light exiting the laser in region 140 is collected by the lens 127, which is formed at the end of the fiber pigtail 124 for transmission to the fiber amplifier 112.

As also common, the pump laser 120 has front facet coating(s) 142. These typically provide for front facet passivation to prevent front facet catastrophic failure and to provide front facet reflectivity. As also typical, there are some rear facet coatings 144. In a typical implementation, these rear facet coatings 144 are designed to maximize rear facet reflectivity so that most of the light generated by the laser is available for useful pump light.

According to the present invention, the rear facet 144 comprises a first reflective structure 146 and a second rear facet reflective structure 148. This integrated wavelength-selective rear-facet reflector controls the longitudinal modal operation of the pump laser. Specifically, it provides selective wavelength reflectivity, or functions as a bandpass reflector, to facilitate longitudinal modal stability of the pump laser 120 by favoring the establishment of a narrow lasing spectrum in the pump laser 120 to thereby prevent or at least reduce, spectral shifting.

Figure 2:
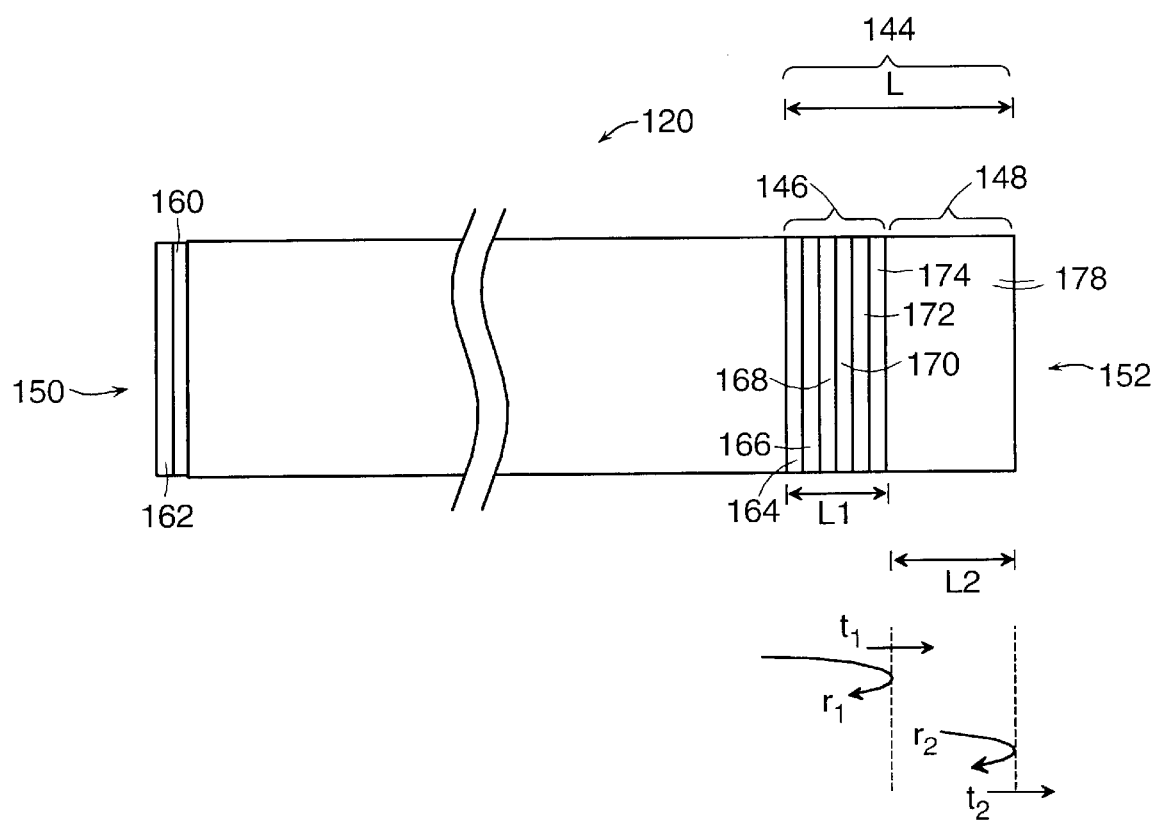
FIG. 2 is a top plan view of the back-etalon-stabilized laser pump chip showing the front and rear facet material layers in the preferred embodiment of the present invention.

FIG. 2 better shows the coating for front facet 150 and the rear facet 152.

Specifically, the front facet, as is common, preferably comprises a first passivation layer 160 in one implementation, this can be a very thin coating of silicon, for example. To provide front facet reflectivity to maximize power output, the front facet also preferably comprises a second layer 162 of aluminum oxide $Al_2O_3$. In the preferred embodiment, the front facet reflectivity is between 2 and 10%. (Note that all reflectivities are in power reflectivity, unless noted otherwise.)

In the preferred embodiment, the reflectivity is between 3 and 5 percent, specifically, 4% +/−0.5%.

As noted earlier, the coatings 144 on the rear facet 152 preferably comprise a first reflective structure 146 and a second reflective structure 148. Preferably, the total thickness "L" of the first and second reflective structures is less than 100 micrometers to reduce beam losses at the rear facet due to beam divergence. Preferably, however, the first and second reflective structures are less than 20 micrometers in total thickness, L=20 micrometers or less.

More specifically, in the preferred embodiment, the first layer on the rear facet is again preferably a passivation layer 164. Again, this passivation layer is preferably very thin.

After the passivation layers, multiple quarter-wave ($\lambda/4$) layers of alternating low and high index materials 166–175 are deposited on the rear facet 152 on top of the silicon passivation coating 164 to form the first reflective structure 146. The alternating structure of low and high refractive indices provides the additional phase change to give constructive interference between rays reflected at each index or material junction. Each of these layers is deposited with an optical thickness of 245 nm and a tolerance of approximately +/−5% for 980 nm pumps.

Specifically, a low index aluminum oxide layer is used 166. Next, a high index titanium oxide ($TiO_2$) layer 168 is used. Next, a low index silicon dioxide layer 170 is used. Then, another titanium oxide high index layer 172 is used. A low index silicon oxide layer 174 is next.

The second reflective component 148 results from the outer interface between layer 178 and air. In the preferred embodiment, this is a thick layer of titanium oxide ($TiO_2$). Specifically, the titanium oxide thick layer 178 of the second reflective structure 148 is preferably between 10 and 60 $\lambda$ (wavelengths) thick. In the current embodiment, it is approximately 30 wavelengths or 12 micrometers (physical distance) or (12*2.35)=28 micrometers (optical distance) in the 980 nm laser implementation described. Note, inside the etalon layer an optical thickness of 980 nm or one wavelength corresponds to a physical distance of (980 nm/2.35)= 417 nm for light that has a wavelength of 980 nm in air.

The etalon is said to be resonant for wavelengths having a maximum amount of energy stored within the etalon layer of thickness $L_{eff}$. An etalon is anti-resonant for wavelengths that have a minimum amount of energy stored within the layer of thickness $L_{eff}$. Note $L_{eff}$ is approximately equal to $L_2$ except for a slight adjustment due to the phase shifts at each reflector.

The field transmission of the etalon is given by $$t_{net} = \frac{t_1 t_2 e^{-i\frac{2\pi}{\lambda_0}n_e L_{eff}}}{1 + r_1 r_2 e^{-i\frac{4\pi}{\lambda_0}n_e L_{eff}}}, \quad (1)$$

where $t_1$ represents the field transmission of the first-deposited (inner) side of the etalon, $t_2$ represents the transmission of the outer side of the etalon, $r_1$ represents the field reflectivity of the first-deposited (inner) side of the etalon, and $r_2$ represents the field reflectivity of the outer side of the etalon. The etalon is resonant when $L_{eff}$ is an even multiple of $\lambda_0/4n_e$. This is defined as the resonant condition (when the maximum amount of energy is stored in the etalon). The present invention is intended to stabilize the laser when $L_{eff}$ is an odd multiple of $\lambda_0/(4n_e)$ (at the anti-resonant condition of the etalon). The resonance condition provides maximum transmission since the greatest amount of light is then incident on the second reflector. Resonance occurs when the term $r_1 r_2 \text{Exp}(-i4\pi n_e L_{eff}/\lambda_0)$ is of minimum value. For example if $r_1$ is negative and $r_2$ is positive, the minimum value of this product is obtained when $L_{eff}$ is an even multiple of $\lambda_0/4n_e$.

For the first reflective structure (five individual quarter-wavelength layers with index 1.6, 2.35, 1.47, 2.35, and 1.47 followed by a terminating layer of index 2.35) the field reflectivity viewed from inside the laser is $r_1 \approx -0.9$. To achieve wavelength selectivity, a relatively thick dielectric layer deposited on the facet is used. It would need to have $L_2 = \lambda^2/(2n_e \Delta\lambda)$ to achieve a periodicity of $\Delta\lambda$. Thus, if a spectral periodicity of 16 nm is desired, a thickness of ~12.7 microns is desired. Divergence is significant when there is no waveguiding confinement, however, the effects of divergence drops with $1/n_e^2$ since angular spread drops with the reciprocal of the material index of refraction, $1/n_e$, and the required thickness drops with the reciprocal of the group index of the material, $1/n_e$. The material should have low absorption at the lasing wavelength. Due to diffraction of the beam, about ⅕ of the returning power is coupled back into the waveguide. However, due to the coherent nature of the reflection, this is found to be adequate for selecting a narrow band of modes within a +/−2 nm range when the semiconductor gain peak moves 15 nm.

The net field reflectivity is then approximately:

$$r_{net} = r_1 + \frac{\gamma |t_1|^2 r_2 e^{-i\frac{4\pi}{\lambda_0}n_e L_{eff}}}{1 + \gamma r_1 r_2 e^{-i\frac{4\pi}{\lambda_0}n_e L_{eff}}}, \quad (2)$$

where $\gamma$ is the factor representing reduction in field strength due to the incomplete coupling of the divergent reflected beam back into the laser waveguide. Note, antiresonance of the etalon provides the minimum transmission and the maximum reflectivity. In short, light reflected by the second reflective structure 148 is reflected out of phase with light reflecting off the first reflective structure 146 for the undesired wavelengths. This yields a wavelength selective rear facet reflector defined by the net field reflectivity $r_{net}$.

Figure 3A:
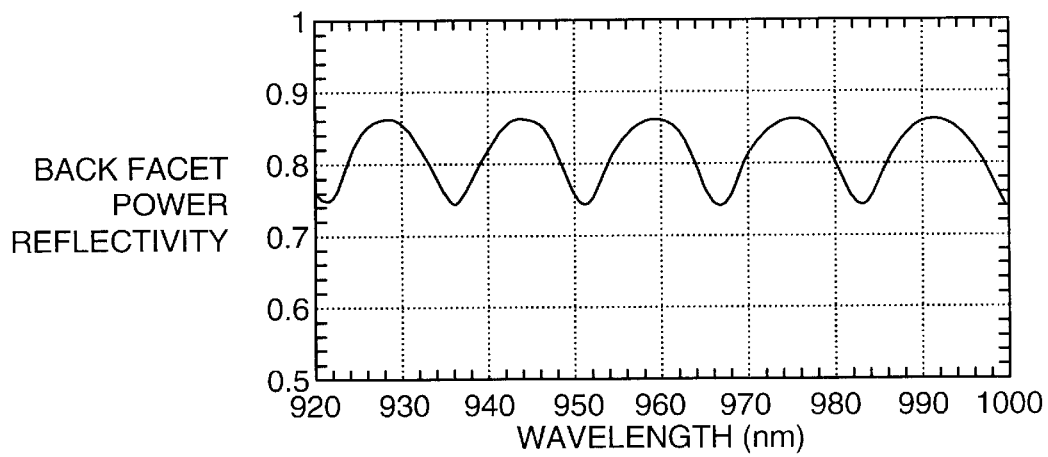
FIGS. 3A–3D shows the reflection spectrum of back etalon viewed from inside laser, net round trip gain Exp[2 (g−a)L]$R_1R_2$ when material gain peak is at 969 nm, net round-grip gain when material gain peak is at 975 nm, and net round-trip gain when material gain peak is at 982 nm, respectively.
Figure 3B:
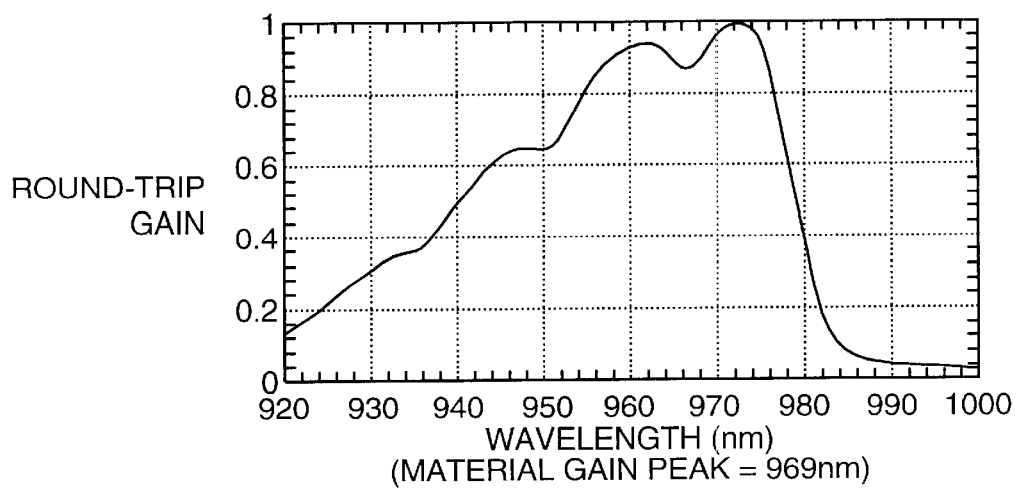
Figure 3C:
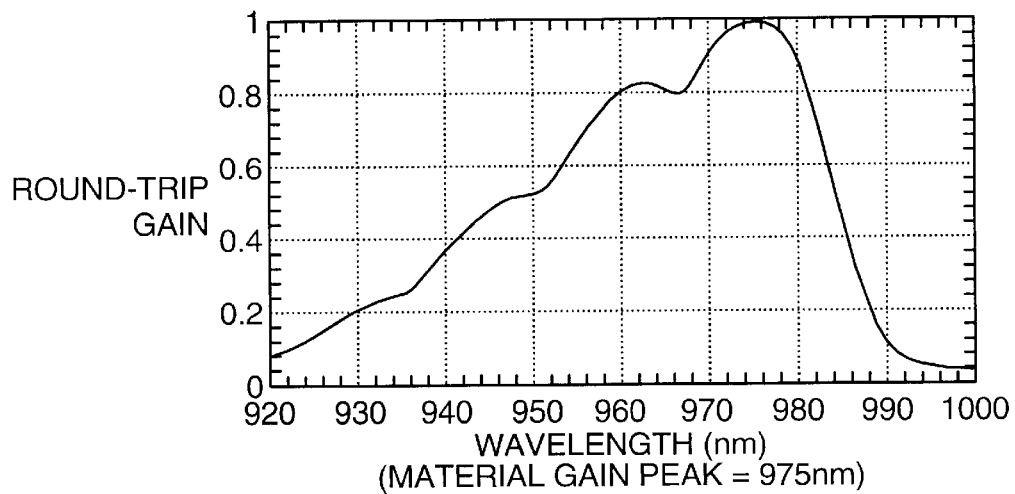
Figure 3D:
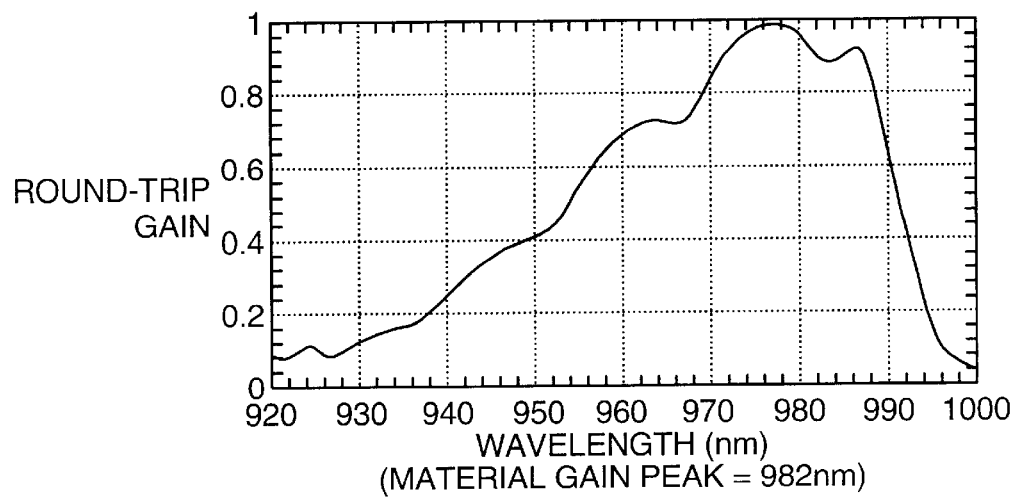

FIG. 3A shows the rear facet reflectivity as a function of wavelength. As illustrated, according to the present invention, this reflectivity peaks at approximately 90 percent at between 970 and 980 nm. FIG. 3B–3D show the laser net gain spectrum for various material gain offsets. It shows the laser wavelength is well controlled for any material gain peak 969 nm to 982 nm.

In the preferred embodiment, no additional coatings are placed on the thick titanium oxide layer 178. That is, the second reflective structure 148 comprises only the titanium oxide layer 178. Although additional layers can be included to further increase the total rear facet reflectivity, these have the effect of flattening the peaks in the reflectivity curves shown in FIG. 3, while providing better cut-off.

Figure 4:
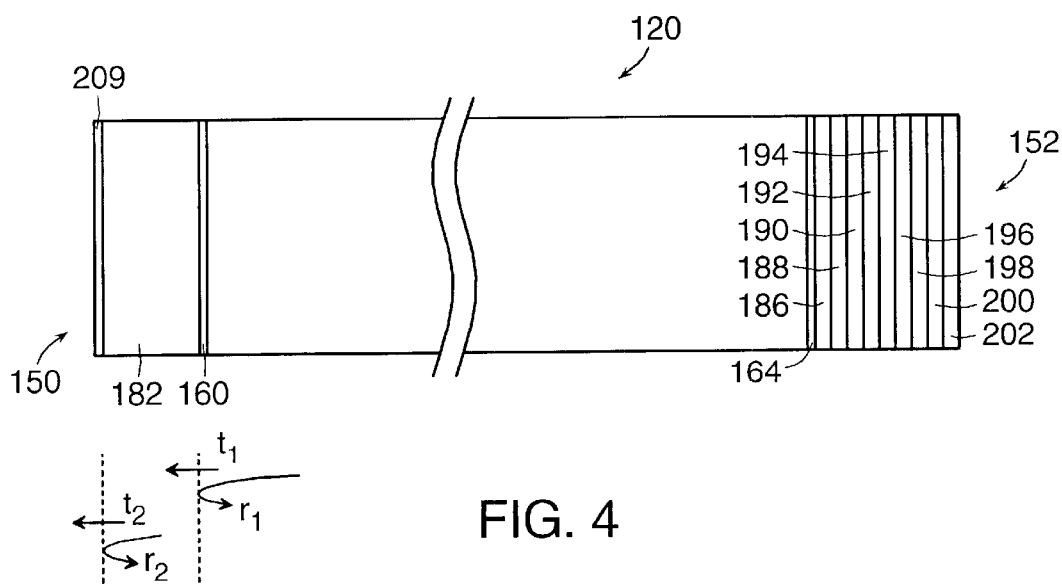
FIG. 4 is a top view of the front-etalon-stabilized laser pump chip showing the front and rear facet material layers according to another embodiment of the present invention.

FIG. 4 shows another embodiment where the wavelength selective layers for pump wavelength stabilization are located on the front facet. The same type of anti-resonant etalon is deposited on the front (output side) facet 150 of the laser 120. When an etalon is placed on the front of the laser, a low reflectivity is needed for all wavelengths near the laser's gain peak. Thus, the reflectivity for each interface defining the etalon must be small to achieve at least 80% of the power exiting from the front facet 150. For the front etalon structure one should have both $|r_1|^2 < 15\%$ and $|\gamma r_2|^2 < 15\%$. This can be achieved by using small index difference between subsequent materials. The preferred embodiment for the front coating of the pump is to follow the pump's front passivation layer (160) with a material that has an intermediate index, between the semiconductor's index of refraction (e.g. ~3.4) and the index of refraction of air (e.g. ~1.0). A layer of about 3–30λ, (15λ or about 6.2 μm in physical distances in the present embodiment) in thickness of TiO₂ 182 will provide ripples with deep modulation depth in the pump's effective gain curve, thereby providing the refractive index interfaces-the first interface ($r_1$) is on the inner side of layer 182, and the second interface is on the outer side ($r_2$). Since the modulation depth is much larger, wider free-spectral range of the etalon will still provide strong wavelength stabilization.

In this embodiment, the back reflector is first coated with the thin passivation layer 164. After the passivation layer, multiple quarter-wave ($\lambda/4$) layers of alternating low and high refractive index materials 186–202 are deposited on the rear facet 152. Typically, eight layers are used to emit about 95% of the power out of the front facet. Note, $r_1$ and $r_2$ are of same sign for this front etalon version and therefore, an even number of quarter wavelengths satisfies the anti-resonant condition and represents the wavelength at which the laser will be stabilized. Where $\lambda_0$ is the chosen pump wavelength, the front etalon 182 thickness should be an even multiple of $\lambda_0/4n_e$.

Figure 5A:
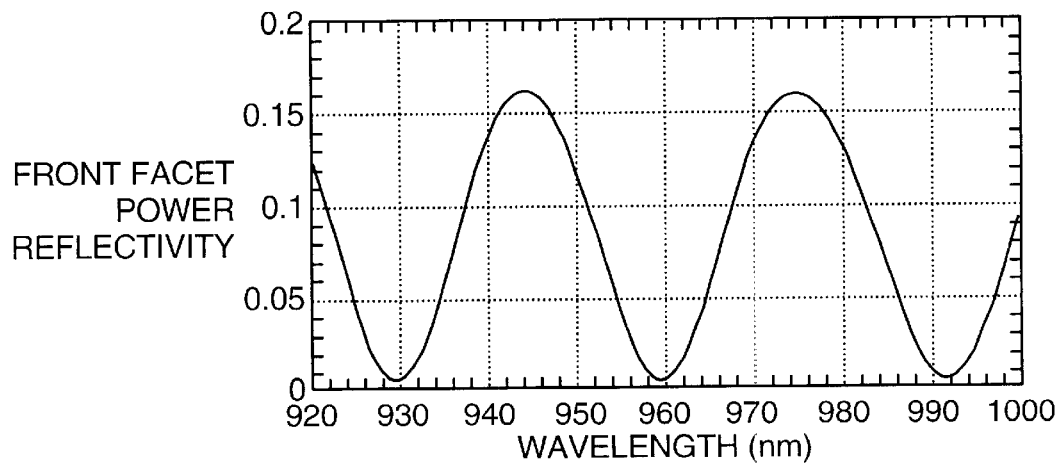
FIGS. 5A–5D show the reflection spectrum of front etalon viewed from inside laser, net round trip gain of laser with front etalon when material gain peak is at 967 nm, net round-grip gain when material gain peak is at 975 nm, and net round-trip gain when material gain peak is at 993 nm, respectively, for the second embodiment.
Figure 5B:
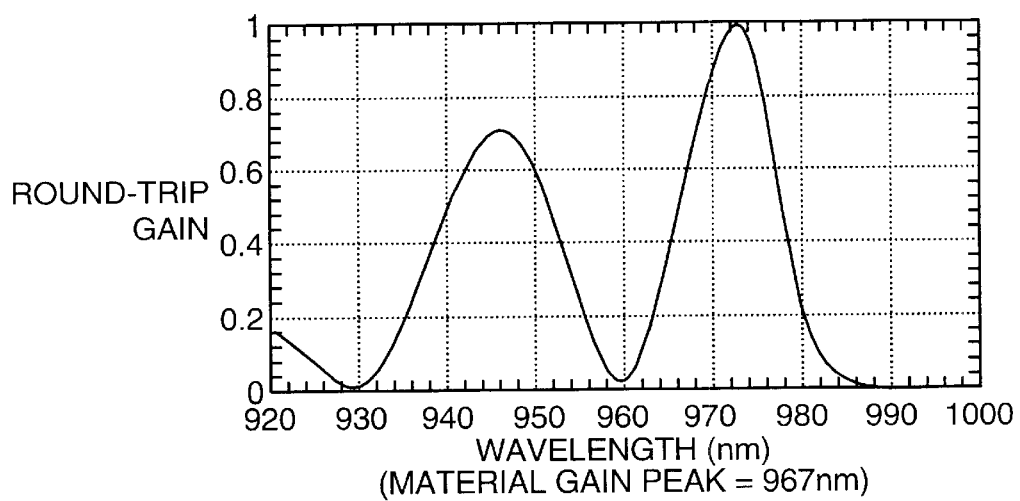
Figure 5C:
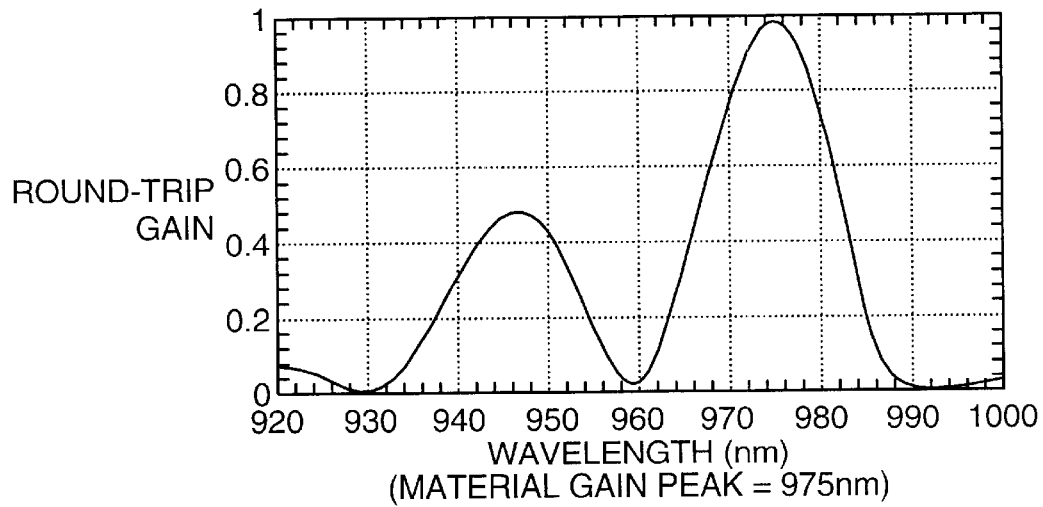
Figure 5D:
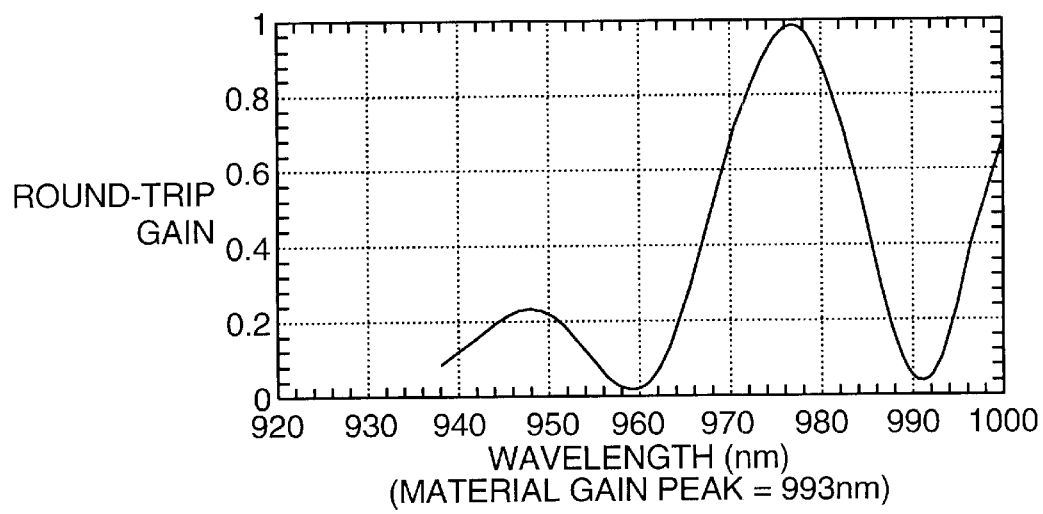

FIG. 5A shows the reflectivity spectrum from the front etalon for the preferred embodiment and FIGS. 5B–5D show the net round-trip gain of the front-etalon stabilized pump for various shifts in gain spectrum. Thus, by eqn. (2) a 6.2 μm single layer of TiO₂ (measured using physical distance) provides a peak reflectivity of about 15% maximum reflectivity for which the laser will lock to, and the single layer etalon provides a smaller reflectivity for other wavelengths near the semiconductor's gain peak. In order to emit the great majority of power (>95%) out of the pump's front facet, the preferred embodiment with front etalon would use about 95% power reflectivity at the back facet.

FIGS. 5A–5D show that the pump will have wavelength stabilized close to 975 nm when the material gain peak is anywhere in the range 967 nm–993 nm. Additional thin layers 209, thinner than a half wavelength, could also be added to the thick layer 182 to further reduce $r_2$.

While this invention has been particularly shown and described with references to preferred embodiments thereof, it will be understood by those skilled in the art that various changes in form and details may be made therein without departing from the spirit and scope of the invention as defined by the appended claims. For example, in still other embodiments, an etalon structure is deposited on both front and back facets.

What is claimed is:

1. A semiconductor pump laser, comprising:
an electro-optical ridge waveguide that converts a ridge injection current into light in an active layer having a material gin curve and integral front and rear facets arranged to reflect light back and forth in a resonant Fabry-Perot cavity through the active layer for lasing in a wide band of wavelengths, including a desired narrow lasing frequency band, within the material gain curve for providing a longitudinal modal operation of the pump laser; and
a wavelength selective facet reflector integrated into one of the front and rear facets of the waveguide, the wavelength selective facet reflector comprising an anti-resonant etalon, the anti-resonant etalon stabilizing longitudinal modal operation of the pump laser to the desired narrow lasing frequency band, wherein the anti-resonant etalon having a thickness and other characteristics precisely controlled for maximizing reflectivity an minimizing transmission at the desired narrow lasing frequency band, anti-resonant etalon is optically coupled to the active layer to modify round-trip gain of the resonant cavity in the active layer, wherein the anti-resonant etalon is selected to enhance lasing in the desired narrow lasing frequency band by feeding-back reflectivity to increase the round-trip cavity gain and to suppress lasing at other wavelengths within the material gain curve by increasing the round-trip cavity loss outside of the desired narrow lasing frequency band.

2. A semiconductor laser as described in claim 1, wherein the anti-resonant etalon integrated into the rear facet comprises a single layer having a thickness that is an odd multiple of quarterwavelenghs ($\lambda_0/4n_e$).

3. A semiconductor laser as described in claim 1, wherein the anti-resonant etalon integrated into the front facet comprises a single layer having a thickness that is an even multiple of quarterwavelenghs ($\lambda_0/4n_e$).

4. A semiconductor laser as described in claim 1, wherein the pump laser optically pumps a fiber amplifier in a dense wavelength division multiplexed system, one of the front and rear facets of the waveguide having the wavelength selective facet reflector as a first reflective structure for providing modal stability to reduce wavelength shifts of the pump laser in the wide band of waveless of about 16 nm by allowing a second reflective structure in one of the front and rear facets to favor lasing in the desired narrow lasing frequency band by providing out-of-phase reflection with the first reflective structure for increasing the round-trip cavity loss outside of the desired narrow lasing frequency band.

5. A semiconductor laser as described in claim 1, wherein the ridge waveguide of the electro-optical structure is formed only in an upper cladding layer to yield a weakly guided laser device.

6. A semiconductor laser as described in claim 4, wherein the second reflective structure has a wavelength selective reflectivity for providing wavelength control to +/−2 nm to a predetermined wavelength in the desired narrow lasing frequency band.

7. A semiconductor laser as described in claim 1, wherein the facet reflector comprises a first reflective structure for reflecting light to return through the ridge waveguide electro-optical structure and a second reflective structure comprising the anti-resonant etalon for providing wavelength selective reflectivity in combination with the first reflective structure.

8. A semiconductor laser as described in claim 7, wherein the total thickness of the first and second reflective structures is less than 100 micrometers.

9. A semiconductor laser as described in claim 7, wherein the total thickness of the first and second reflective structures is between 3 and 20 micrometers.

10. A semiconductor laser as described in claim 7, wherein the fist reflective structure is located on a rear facet of the pump laser and comprises six multiple quarter-wave layers of alternating low and high index materials.

11. A semiconductor laser as described in claim 7, wherein the first reflective structure is located on a rear facet of the pump laser and comprises multiple quarter-wave layers of alternating low and high index materials.

12. A semiconductor laser as described in claim 11, wherein the second reflective structure comprises a relatively thick layer.

13. A semiconductor laser as described in claim 11, wherein the second reflective structure comprises a layer of 10–60 wavelengths in thickness.

14. A semiconductor laser as described in claim 11, wherein the second reflective structure comprises only a single layer with no subsequent reflective layers.

15. A semiconductor laser as described in claim 1, wherein the rear facet, has a reflectivity of greater than 75% at the wavelength of operation and the front facet has between 3–10% reflectivity at the wavelength of operation.

16. A semiconductor laser as described in claim 15, wherein the front facet has a reflectivity of 3–5% at the wavelength of operation.

17. A semiconductor laser as described in claim 16, wherein the front facet has a nominal reflectivity of about 4% at the wavelength of operation.

18. A semiconductor laser as described in claim 1, wherein the facet reflector is on the front of the pump laser and the index steps are small so that power reflectivity is less than 15%.

19. A semiconductor laser as described in claim 18, wherein the facet reflector is between 3 $\mu$m and 30 $\mu$m thick.

20. A semiconductor laser as described in claim 18, wherein the facet reflector is between 3 and 30 wavelengths thick.

21. A semiconductor laser as described in claim 1, wherein an etalon structure is deposited on both the front and rear facets.

22. A semiconductor 980 nanometers pump laser having increased longitudinal modal stability for optically pumping a fiber amplifier in a dense wavelength division multiplexed system with reduced spectral shifting, the pump laser comprising:
an electro-optical ridge waveguide that converts a ridge injection current into light; and
a wavelength-selective rear facet reflector integrated into the waveguide which controls longitudinal modal operation of the pump laser, the rear facet reflector comprising a first reflective element for reflecting light to return through the ridge waveguide and a second reflective element comprising an anti-resonant etalon for providing a wavelength selective reflectivity in combination with the first reflective element, wherein the first reflective element comprises multiple quarter-wave layers of alternating low and high index materials and the second reflective element comprises a relatively thick layer of 10–60 wavelength in thickness for constraining the laser to lase only a desired narrow lasing frequency band by reflecting light in a desired wide lasing frequency band containing the desired narrow lasing frequency band.

23. A semiconductor 980 nanometers pump laser having increased longitudinal modal stability for optically pumping a fiber amplifier in a dense wavelength division multiplexed system with reduced spectral shifting, the pump laser comprising:
- an electro-optical ridge waveguide that converts a ridge injection current into light; and
- a wavelength-selective front facet reflector integrated into the waveguide comprising an anti-resonant etalon controlling longitudinal modal operation of the pump laser, which is 3–30 wavelengths in thickness for constraining the laser to laser only in a desired narrow lasing frequency band by reflecting light in a desired wide lasing frequency band containing the desired narrow lasing frequency band.

* * * * *